United States Patent [19]

Ohta et al.

[11] Patent Number: 5,443,932
[45] Date of Patent: Aug. 22, 1995

[54] EXPOSURE METHOD

[75] Inventors: Hirohisa Ohta, Sagamihara; Kunitaka Ozawa, Isehara; Eigo Kawakami, Ebina; Shunichi Uzawa, Tokyo, all of Japan

[73] Assignee: Canon Kabushiki Kaisha, Tokyo, Japan

[21] Appl. No.: 161,099

[22] Filed: Dec. 3, 1993

Related U.S. Application Data

[63] Continuation of Ser. No. 892,722, May 29, 1992, abandoned, which is a continuation of Ser. No. 413,732, Sep. 28, 1989, abandoned.

[30] Foreign Application Priority Data

Sep. 30, 1988 [JP] Japan ............... 63-246259

[51] Int. Cl.[6] ............................................. G03F 9/00
[52] U.S. Cl. ..................................... 430/22; 430/397; 355/53; 355/77; 356/399
[58] Field of Search ............. 430/22, 397; 355/53, 355/55, 77; 356/399, 400, 401

[56] References Cited

U.S. PATENT DOCUMENTS

| | | | |
|---|---|---|---|
| 4,623,608 | 11/1986 | Andrevski | 430/22 |
| 4,669,868 | 6/1987 | Chapelle et al. | 355/53 |
| 4,676,630 | 6/1987 | Matsushita et al. | 355/53 |
| 4,748,477 | 5/1988 | Isohata et al. | 355/53 |
| 4,864,360 | 9/1989 | Isohata et al. | 355/53 |
| 4,870,668 | 9/1989 | Frankel et al. | 378/205 |
| 4,891,526 | 1/1990 | Reeds | 356/401 |
| 4,998,134 | 3/1991 | Isohata et al. | 355/53 |

FOREIGN PATENT DOCUMENTS

| | | | |
|---|---|---|---|
| 0253349 | 1/1988 | European Pat. Off. | |
| 57-17132 | 1/1982 | Japan | 430/22 |
| 58-128735 | 8/1983 | Japan | 430/22 |
| 61-84018 | 4/1986 | Japan | |
| 8906430 | 7/1989 | WIPO | |

Primary Examiner—Marion E. McCamish
Assistant Examiner—Kathleen Duda
Attorney, Agent, or Firm—Fitzpatrick, Cella, Harper & Scinto

[57] ABSTRACT

An exposure method includes disposing a mask and a semiconductor wafer opposed to each other in a close proximity relation with respect to a Z-axis direction and printing a pattern of the mask on each of different shot areas of the semiconductor wafer in a step-and-repeat manner, with a predetermined exposure energy. In this method, the spacing between the mask and the wafer for the paralleling of them is made larger than the spacing therebetween as assumed at the time of mask-to-wafer alignment with respect to X-Y plane or the spacing between the mask and the wafer as assumed at the time of exposure of the wafer to the mask. After the paralleling of the mask and the wafer, the mask and the wafer are moved closer to each other in the Z-axis direction and alignment and exposure is performed. This ensures that the alignment and exposure are effected at an optimum spacing while, on the other hand, contact of the mask and the wafer at the time of paralleling is precluded.

5 Claims, 4 Drawing Sheets

FIG. 4

EXPOSURE METHOD

This application is a continuation of application Ser. No. 07/892,722 filed May 29, 1992, now abandoned, which is continuation of Ser. No. 07/413,732 filed on Sep. 28, 1989, now abandoned.

FIELD OF THE INVENTION AND RELATED ARTS

This invention relates to an exposure method wherein a workpiece such as a wafer, for example, and an original such as a mask, for example, are disposed opposed to and close to each other and a pattern of the original is printed onto a part of the workpiece and wherein the workpiece is displaced relative to the original, along a plane perpendicular to the opposing direction, such that the alignment of them and the pattern printing are repeatedly effected.

Recently, rapid advancement has been attained in semiconductor integrated circuits, particularly with respect to the enhancement of the degree of integration, and active development is being made to very large scaled integrated circuits (VLSIs) using submicron patterns. To realize printing of such submicron patterns onto semiconductor wafers, X-ray lithography becomes attractive.

In X-ray lithography using X-rays as an exposure light source, because no suitable reduction lens is available with respect to X-rays, it is usual that a mask and a wafer are disposed opposed to each other in close proximity so that the exposure is effected at a unit magnification. In X-ray lithography, it is therefore necessary to form a submicron pattern on a mask. Further, in consideration of the tendency to enlargement of the diameter of a wafer and the resultant difficulty in preparing such a mask by which the whole surface of a large-diameter water can be exposed by one exposure, a step-and-repeat process in which the wafer surface is divided into zones and, for each zone, the mask-to-wafer alignment and the exposure are made, will be adopted also in X-ray lithography.

SUMMARY OF THE INVENTION

However, in consideration of the status quo of the flatness of a wafer (wavy, wedgy and the like), if the mask-to-wafer spacing is retained as in the very close proximity relationship at the time of exposure and, if while maintaining such spacing, the alignment of the mask and wafer (including their parallel relationship) as well as the shift of the relative position therebetween are executed, then there arises the possibility of contact of the mask and wafer thereby resulting in damage of the mask pattern.

It is accordingly an object of the present invention to prevent, in an exposure method based on X-ray lithography or otherwise in which an original and a workpiece are disposed opposed to each other and in close proximity to each other, possible contact between the original and the workpiece during the alignment of them or a shift of the relative position therebetween.

In an exposure method according to the present invention, to achieve the above object, in regard to the alignment of an original such as a mask with a workpiece such as a wafer, the spacing between them for correction of a gap (in Z-axis direction) and of surface inclination (Wx, Wy) is set at a position spaced by a larger distance as compared with the exposure gap to be assumed at the time of exposure. Thus, while precluding the danger of contact between the original and the workpiece, they are made parallel. As a consequence, when after making the workpiece and the original parallel the gap is reduced to the exposure gap, the original and the workpiece do not contact to each other (in an opposed relationship). Further, the spacing at the time of paralleling step is set at such a position that the original and the workpiece do not contact to each other even if they are displaced relative to each other along an X-Y plane. This prevents contact during movement from one shot area to another.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
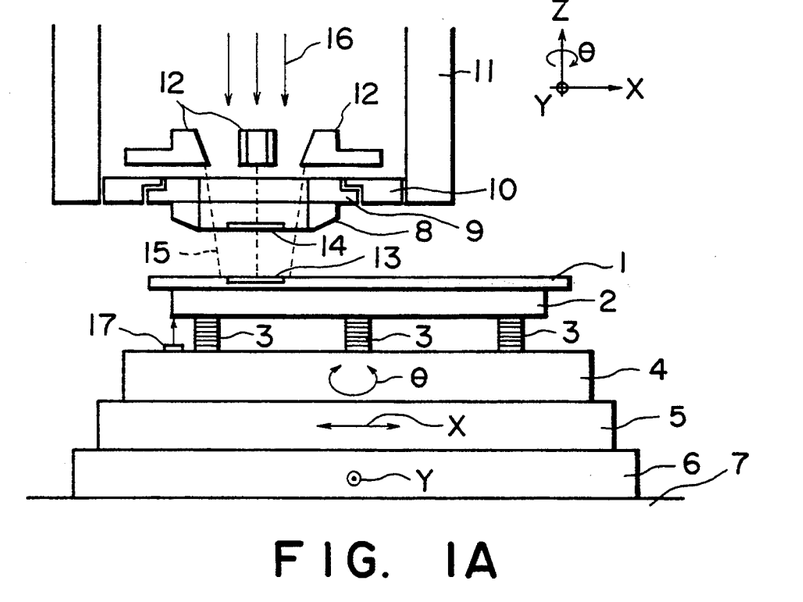
FIGS. 1A and 1B illustrate a major part of an exposure apparatus to which an exposure method according to an embodiment of the present invention is applied.
Figure 1B:
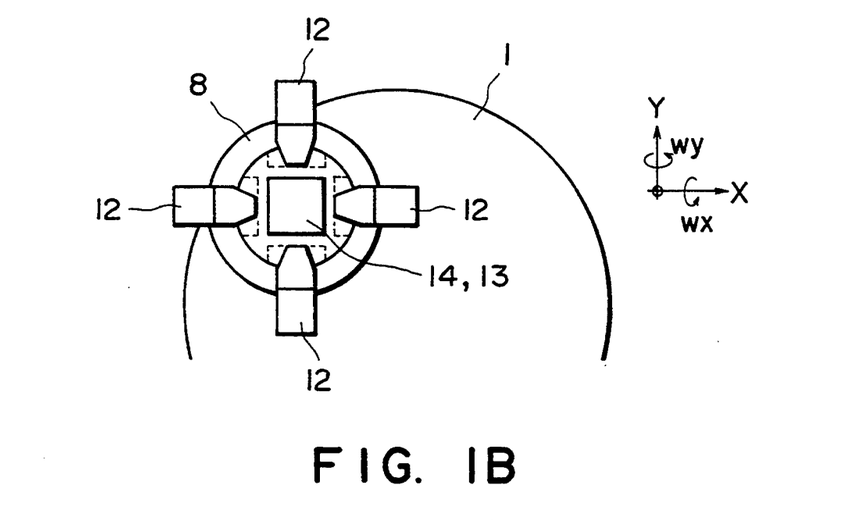

FIGS. 1A and 1B show a major portion of an exposure apparatus to which an exposure method according to one embodiment of the present invention is applied. This method can be used as part of a process for manufacturing a semiconductor wafer. FIG. 1A is a side sectional view, and FIG. 1B is a top plan view of a part including a mask and a detection optical system.

In FIGS. 1A and 1B, denoted at 1 is a wafer, and denoted at 2 is a wafer chuck for holding wafer 1. The wafer chuck 2 attracts by vacuum attraction the bottom surface of the wafer 1 through grooves, not shown. The chucking method is not limited to vacuum attraction, and one which can be called "electrostatic attraction" is practically usable. Denoted at 3—3 are wafer chuck holding members each effective to point-support the wafer chuck 2. Each wafer chuck holding member 3 comprises accumulated sheet-like electrically conductive elements and is adapted to adjust the height (the position in the Z-axis direction) of each supporting point for the wafer chuck 2, to a change in vertical direction (Z-axis direction) of the conductive elements which change is caused in response to application of an electric voltage thereto. By changing the height of each wafer chuck holding member 3, it is possible to adjust the Z-axis position as well as inclination Wx (rotational component about the X axis), Wy (rotational component about the Y axis) of the wafer chuck 2 and thus the wafer 1 held on the wafer chuck 2. In the present embodiment, three wafer chuck holding members 3 are provided and disposed equidistantly around the wafer chuck 2, in the θ direction, to thereby allow the wafer to have any desired inclination.

Denoted at 4 is a θ stage which is rotatable in the θ direction (rotational component about the Z axis) about the center of the wafer chuck 2. The θ stage 4 is supported on an X-axis stage 5 which is movable along the X-axis (horizontal as viewed in FIGS. 1A and 1B). The X-axis stage 5 is supported on an Y-axis stage 6. The Y-axis stage 6 is movable along the Y-axis (vertical as viewed in the drawings), and is supported on a base 7. Denoted at 9 is a mask chuck, to a lower end surface of which a mask 8 is magnetically attracted. The attraction is not limited to magnetic attraction and, as an example, vacuum attraction may be adopted. Denoted at 10 is a mask stage to which the mask chuck 9 is fixed. The mask stage 10 is held by a frame member 11.

Denoted at 12—12 are detection optical systems which are adapted to detect alignment marks formed on the wafer 1 and the mask 8 in association with the detection optical systems 12, respectively, to thereby perform measurement of the gap (spacing) between the mask and the wafer in the Z-axis direction as well as measurement of any alignment error between the mask and the wafer with respect to the X-axis and Y-axis directions. In this embodiment, as best seen in the top plan view of FIG. 1B, four detection optical systems 12 are provided. On the basis of the gap measurement at these four points, an approximation surface that passes these four points is calculated and Z error, Wx error and Wy error from a parallel plane are detected. Also, on the basis of the measurement of alignment errors at the four points, X error, Y error and θ error of a particular shot area on the wafer which is just going to be exposed, with respect to the mask, are detected.

If all the measurements at the four points are not possible (due to measurement error or as in the case where, depending on the shot layout, one corner is out of the wafer), by using remaining information the calculation is made to obtain Z, Wx, Wy; and X, Y and θ. Further, in this embodiment, each unit of the detection optical systems 12 executes the gap measurement and the alignment error measurement at one site. However, this is not essential and these measurements may be made by separate units.

Denoted at 15—15 are detection lights from the detection optical systems 12—12. Each detection light 15 is projected with inclination and, therefore, at the time of exposure the detection optical system 12 does not block the exposure light 16. Accordingly, there is no necessity of retracting the detection optical systems 12 at the time of exposure.

Denoted at 16 is the exposure light by which a device pattern 14 formed on the mask 8 can be printed on a pattern 13 having been transferred onto the wafer 1 through the preceding layer process or processes. Denoted at 17 is an eddy current sensor which is provided on the θ stage 4 and which is adapted to measure, relatively, the position of the bottom surface of the wafer chuck 2.

Figure 2A:
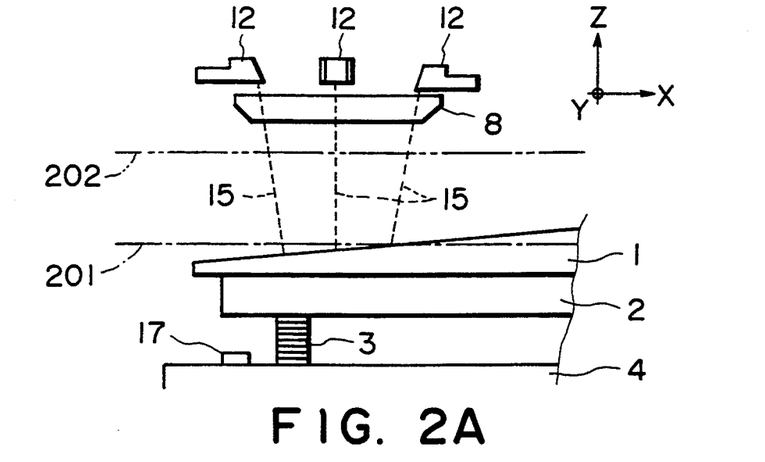
FIGS. 2A–2C are schematic representations, illustrating the sequence of mask-to-wafer paralleling made in that embodiment.
Figure 2B:
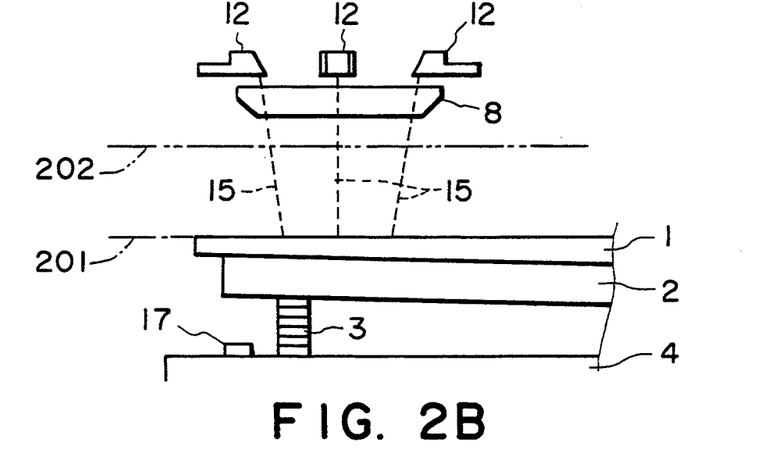
Figure 2C:
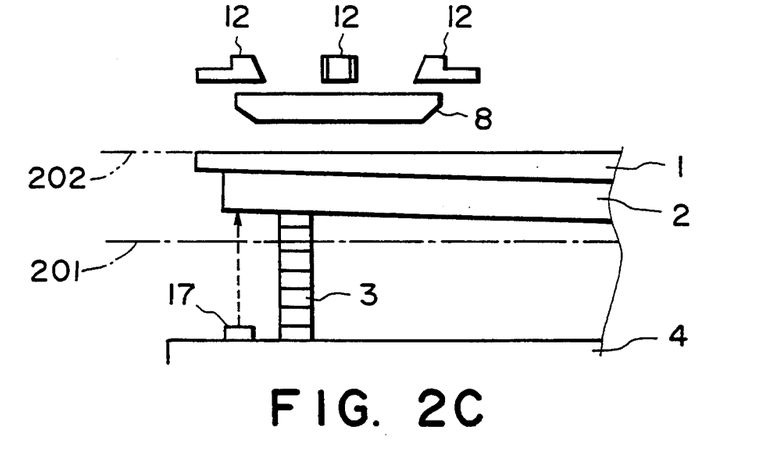

FIGS. 2A–2C are schematic representations, illustrating the sequence from the mask-to-wafer paralleling to the positioning of the wafer to the alignment gap, in the exposure apparatus of FIG. 1 example. In FIGS. 2A–2C, the same reference numerals as those in FIG. 1 are assigned to corresponding elements. Now, referring to FIGS. 2A–2C, the manner of paralleling in the apparatus of the present embodiment will be explained.

In FIGS. 2A–2C, a chain line 201 having a dash and single dot, depicts the position at which the paralleling of the mask and the wafer is to be made. The spacing in the Z-axis direction between this position 201 and the mask 8 will be referred to as a "paralleling gap". The paralleling gap 201 is such a gap that, even if a wafer 1 attracted to the wafer chuck 2 is not uniform in thickness but is wedgy or wavy, provided that such nonuniformness is within a preset tolerable range, there is no possibility of contact between the mask 8 and the wafer 1 even when any portion of the wafer I is positioned to be opposed to the mask 8. In this example, the paralleling gap 201 is set at 70 microns from the bottom surface of the mask 8. Chain line 202 having a dash and two dots, depicts the position at which the mask-to-wafer alignment in regard to the X-Y plane is to be executed. The spacing between this position 202 and the bottom surface of the mask 8 will be referred to as an "alignment gap". In the present embodiment, this alignment gap 202 is set to be equal to the exposure gap (the spacing between the wafer and the mask at the time of exposure). As a result, after completion of the alignment, it is possible to directly start the exposure without moving the wafer chuck 2. The alignment gap 202 can be set variably in accordance with the exposure condition or the state of pattern of each layer. In this example, the gap 202 is set in a range of 50-10 microns from the bottom surface of the mask 8.

FIG. 2A shows the state in which a wafer 1 having a wedgy component is chucked by the wafer chuck 2. It is assumed that the wafer chuck holding members 3 have been placed in a parallel state which is the state in which the height of each wafer chuck holding member 3 has been adjusted so that the surface of a standard wafer (a wafer of designed thickness having no wedgy or wavy surface shape), as chucked, coincides with the paralleling gap 201. In this state, through the detection optical systems 12 the mask-to-wafer distance at each measuring point is measured, and the wafer 1 surface, more particularly, the surface as formed by a particular shot area which is just going to be exposed, is calculated and, additionally, errors Z, Wx and Wy from the paralleling surface (a plane parallel to the X-Y plane and containing the position 201), are detected.

FIG. 2B shows a state in which the amount of drive to be made by each wafer chuck holding member 3 for correction of the errors Z, Wx and Wy has been determined and the corrective drive has been completed in accordance with the determined amount. After the corrective drive, the detection optical systems 12 are used again to measure the mask-to-wafer distance, and any residual errors from the paralleling surface are detected. If these errors are within a preset tolerable range, the sequence goes to the next process. If they are out of the tolerable range, the corrective drive is repeated again and any residual errors are checked.

FIG. 2C shows the state in which the wafer chuck holding members 3 have been adjusted so that a particular shot 13 of the wafer 1, at the paralleling gap 201 position, is brought to the alignment gap 202 position, while maintaining the surface inclination thereof. The amount of such motion is given by a fixed amount which is in the form of the difference between the paralleling gap and the alignment gap (the spacing between the positions 201 and 202). The amount of motion in each corrective drive can be checked by measuring the position of the bottom surface of the wafer chuck 2 through the eddy current sensor 17 provided on the wafer stage 4.

In the apparatus of the present embodiment, as described hereinbefore, for a particular shot area 13 of a wafer 1 whose surface condition has not been examined, the paralleling between it and the mask 8 is performed at a position (the paralleling gap 201 position) at which the wafer does not contact to the mask 8 and, thereafter, while retaining the paralleled state, the wafer 1 is, moved to the position (the alignment gap 202 position) at which the mask-to-wafer alignment in respect to the X-Y plane is to be made, and then the alignment and exposure are executed.

Referring now to the flow chart of FIG. 3, the sequence of exposure of one wafer in the exposure apparatus according to the present embodiment will be explained.

First, it is assumed that the X-axis and Y-axis stages 5 and 6 have been driven so that a first shot area on a wafer 1 i.e., is a workpiece is opposed to a mask 8 i.e., and an original that the wafer chuck holding members 3 have been placed in the paralleling state (as illustrated in FIG. 2A).

Initially, at Step 301, through the detection optical systems 12 the mask-to-wafer distance at each measuring point is measured. At Step 302, on the basis of the data obtained through the measurement made at the preceding step, the surface of the shot area on the wafer 1 which is just going to be exposed, is calculated and errors Z, Wx and Wy from the paralleling surface are detected. Here, when these errors are to be detected from the data related to the four points, a least square method is used to calculate a surface which approximately passes the four points. If three-point data is used, the surface is calculated definitely. The obtained errors are compared with a preset tolerance (Step 303). If the errors are out of the tolerable range, the sequence goes to Step 304 at which the wafer chuck holding members 3 are adjusted to correct the errors, and then the sequence goes back to Step 301 at which the measurement is repeated.

If, on the other hand, it is discriminated at Step 303 that the errors are within the tolerable range, the sequence goes to Step 305 at which motions of the same amount are applied to all the wafer chuck holding members 3 and, while retaining the tilt, the wafer 1 is displaced in the Z direction to the position of the alignment gap 202. Subsequently, at Step 306, through the detection optical systems 12 the mask-to-wafer alignment error at each measuring point is measured. Then, at Step 307, from the measured values, the alignment errors X and Y as well as the rotational error θ in the X-Y plane are detected. Then, in a similar way as in the paralleling process, at Step 308 whether or not the detected errors are within a tolerable range is discriminated. If not within the tolerable range, the sequence goes to Step 309 at which the corrective drive is made through the θ stage 4, the X-axis stage 5 and the Y-axis stage 6 and, then, the sequence goes back to Step 306 at which the measurement is made again.

If, at Step 308, the alignment errors are within the tolerable range, the sequence goes to Step 310 at which the pattern of the mask 8 is printed on the wafer 1. In this embodiment, the alignment gap is made equal to the exposure gap and, therefore, the completion of alignment can be directly followed by the exposure process, without the necessity of driving the wafer chuck 2 in the Z-axis direction by means of the holding members 3. However, if moving the wafer chuck 2 after completion of alignment does not cause any inconvenience, the alignment gap may be set to be equal to the paralleling gap.

After exposure of the current shot area is completed, at Step 311 the wafer chuck holding members 3 are brought back into the paralleling state shown in FIG. 2A, and the mask-to-wafer distance is expanded. Then, at Step 312, a discrimination is made as to whether there remains any unexposed shot area on the wafer. If all the shot areas have been exposed, the exposure sequence is finished because the exposure of one wafer has been completed.

If, on the other hand, there remains any unexposed shot area, at Step 313 the X and Y stages 5 and 6 are driven so that the next shot area is opposed to the mask, and the sequence goes back to Step 301. Then, in a similar manner, the paralleling, the alignment and exposure sequence are repeated. It is to be noted that at Step 313 the spacing between the mask and the wafer is such that the relative movement of the mask and the wafer in the X and Y directions does not cause the possibility of contact therebetween and, also, the gap measurement for the paralleling can be made promptly after the movement.

Figure 4:
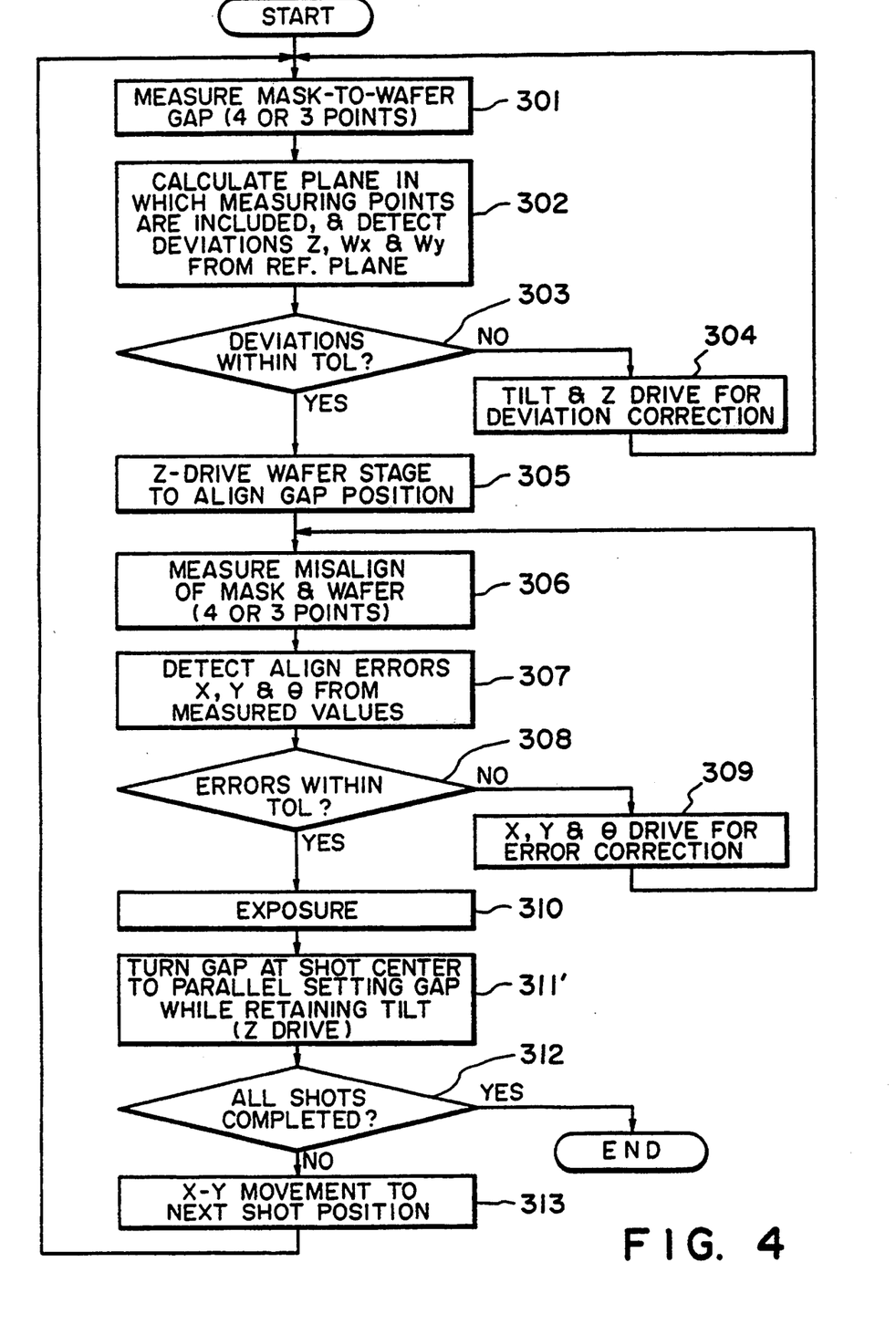
FIG. 4 is a flow chart, illustrating the sequence of exposure of one wafer, according to another embodiment of the present invention.

FIG. 4 is a flow chart showing the sequence of exposure of one wafer, in accordance with another embodiment of the present invention. It is to be noted that the sequence of this figure can be applied to the exposure apparatus shown in FIG. 1.

Figure 3:
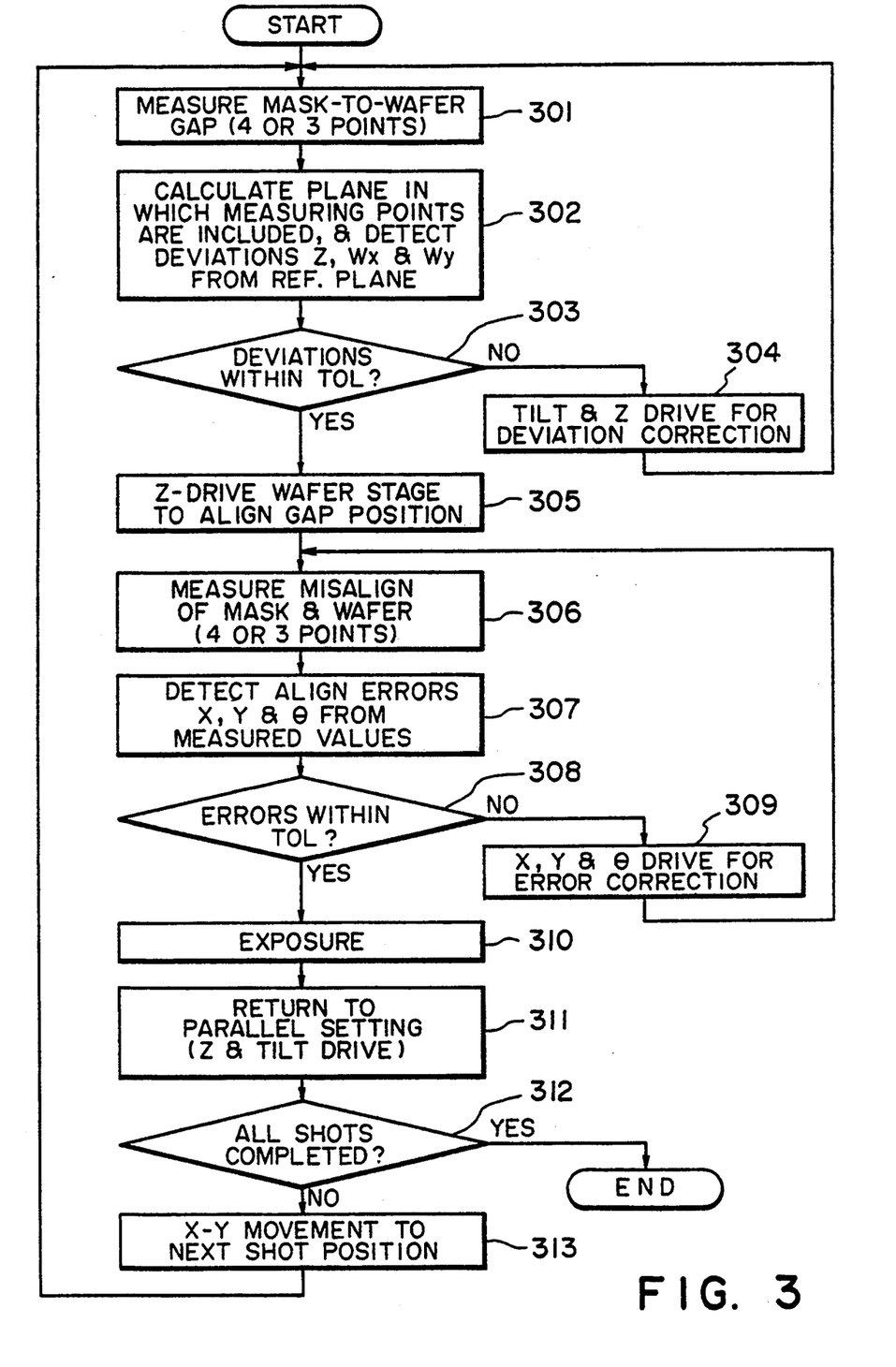
FIG. 3 is a flow chart, illustrating the sequence of exposure of one wafer to be made in the exposure apparatus according to that embodiment.

The sequence of FIG. 4 differs from the sequence of FIG. 3, in the point of a process for expanding the mask-to-wafer gap after completion of exposure of one shot area (Step 310). More specifically, in the foregoing embodiment as has been described with reference to Step 311 (FIG. 3), all the wafer chuck holding devices 3 are brought back into the paralleling state and the tilt of the wafer 1 is released. In the present embodiment, on the other hand, as at Step 311' in FIG. 4, the wafer chuck holding members 3 are adjusted by the same amount so that the center of the exposure shot area comes to the position of the paralleling gap while retaining the tilt. Namely, in this example, at Step 311' the state shown in FIG. 2B is resumed. It is expected that the surface shape of a wafer due to distortion or wedgy component changes continuously. Therefore, by retaining the tilt at the time of movement to the paralleling gap, as in the present embodiment, it is possible to reduce in time the execution of the paralleling sequence in the case where the next shot area is juxtaposed to or in the neighborhood of the current shot area and thus it is possible to improve the throughput.

As has been described in the foregoing, the present invention can provide the following advantageous effects.

(1) Since the paralleling gap between an original such as a mask and a workpiece such as a wafer is made larger than the exposure gap, it is possible to preclude the danger of contact therebetween at the time of alignment of them.

(2) By selecting as the paralleling gap such a spacing by which the original and the workpiece do not contact to each other at the time of relative movement therebetween, it is possible to make the relative moving speed higher and thus to increase the throughput. Also, since the paralleling sequence can start promptly after the relative movement, the throughput can be improved advantageously.

(3) By setting the spacing between the original and the workpiece at the time of X-Y plane alignment to be equal to either the exposure gap or the paralleling gap, the sequence can be simplified with a result of improved throughput.

While the invention has been described with reference to the structures disclosed herein, it is not confined to the details set forth and this application is intended to cover such modifications or changes as may come within the purposes of the improvements or the scope of the following claims.

What is claimed is:

1. An exposure method for printing a pattern of an original on a workpiece, said method comprising the steps of:

moving the workpiece along an X-Y plane so that a first zone of the workpiece is placed opposed to the original in a Z direction intersecting the X-Y plane;

optically measuring the spacing between the original and the workpiece in the Z direction, at least at four points in the vicinity of the first zone;

approximately determining an imaginary plane of the first zone of the workpiece from the measured values obtained with respect to the at least four points, and adjusting any relative inclination of the first zone of the workpiece with respect to the original on the basis of the approximately determined imaginary plane; and decreasing, after said adjusting step, the spacing between the original and the first zone of the workpiece in the Z direction without causing contact between them;

exposing the first zone of the workpiece to a pattern of the original with radiation;

increasing the spacing between the original and a first zone of the workpiece in the Z direction;

moving the workpiece along the X-Y plane so that a second zone of the workpiece is placed opposed to the original in the Z direction;

optically measuring the spacing between the original and the workpiece in the Z direction, at least at four points in the vicinity of the second zone;

approximately determining an imaginary plane of the second zone of the workpiece from the measured valued obtained with respect to the at least four points, and adjusting any relative inclination of the second zone of the workpiece with respect to the original on the basis of the approximately determined imaginary plane of the second zone;

decreasing the spacing between the original and second zone of the workpiece in the Z direction; and exposing the second zone of the workpiece to the pattern of the original with radiation.

2. An exposure method for printing a pattern of an original on a workpiece, said method comprising the steps of:

moving the workpiece along an X-Y plane so that a first zone of the workpiece is placed opposed to the original in a Z direction intersecting the X-Y plane;

detecting a spacing, in the Z direction between the original and the first zone of the workpiece, at different positions adjacent to the first zone;

adjusting, after said detecting step, any relative inclination of the first zone of the workpiece with respect to the original, on the basis of the detection in said detecting step;

decreasing, after said adjusting step, the spacing between the original and the first zone of the workpiece in the Z direction without causing contact between them;

adjusting the relative position, along the X-Y plane, of the original and the first zone of the workpiece, placed opposed to the original, while maintaining the decreased spacing exposing the first zone of the workpiece to a pattern of the original with radiation;

increasing the spacing between the original and a first zone of the workpiece in the Z direction;

moving the workpiece along the X-Y plane so that a second zone of the workpiece is placed opposed to the original in the Z direction;

detecting a spacing, in the Z direction, between the original and the second zone of the workpiece, at different positions adjacent to the second zone;

adjusting, after said second detecting step, any relative inclination of the second zone of the workpiece with respect to the original, on the basis of said second detection in said second detecting step;

decreasing the spacing between the original and the second zone of the workpiece in the Z direction; and exposing the second zone of the workpiece to the pattern of the original with radiation.

3. A method used as part of a process for manufacturing a semiconductor wafer comprising the steps of:

moving a wafer along an X-Y plane so that a first zone of the wafer is placed opposed to a mask in a Z direction intersecting the X-Y plane;

optically measuring the spacing between the original and the workpiece in the Z direction, at least at four points in the vicinity of the first zone;

approximately determining an imaginary plane of the first zone of the workpiece from the measured values obtained with respect to the at least four points, and adjusting any relative inclination of the first zone of the workpiece with respect to the original on the basis of the approximately determined imaginary plane;

decreasing, after said adjusting step, the spacing between the mask and the first zone of the wafer in the Z direction without causing contact between them;

exposing the first zone of the wafer to a pattern of the mask with radiation;

increasing the spacing between the mask and the first zone of the wafer in the Z direction;

moving the wafer along the X-Y plane so that a second zone of the wafer is placed opposed to the mask in the Z direction;

optically measuring the space between the original and the workpiece in the Z direction, at least at four points in the vicinity of the second zone;

approximately determining an imaginary plane of the second zone of the workpiece from the measured value obtained with respect to the at least four points, and adjusting any relative inclination of the second zone of the workpiece with respect to the original on the basis of the approximately determined imaginary plane of the second zone;

decreasing the spacing between the mask and the second zone of the wafer in the Z direction; and exposing the second zone of the wafer to the pattern of the mask with radiation.

4. An exposure method for printing a pattern of an original on a workpiece, said method comprising the steps of:

moving the workpiece along an X-Y plane so that a predetermined zone of the workpiece is placed opposed to the original in a Z direction intersecting the X-Y plane;

optically measuring the spacing between the original and the workpiece in the Z direction, at least at four points in the vicinity of the predetermined zone;

approximately determining an imaginary plane of the predetermined zone of the workpiece from the measured values obtained with respect to the at least four points, and adjusting any relative inclination of the predetermined zone of the workpiece with respect to the original on the basis of the approximately determined imaginary plane;

decreasing, after said adjusting step, the spacing between the original and the predetermined zone of the workpiece in the Z direction without causing contact between them;

exposing the predetermined zone of the workpiece to the pattern of the original with radiation; and increasing, after said exposure, the spacing between the original and the predetermined zone of the workpiece in the Z direction.

5. An exposure method for printing a pattern of an original on a workpiece, said method comprising the steps of:

moving the workpiece along an X-Y plane so that a predetermined zone of the workpiece is placed opposed to the original in a Z direction intersecting the X-Y plane;

adjusting any relative inclination of the predetermined zone of the workpiece with respect to the original;

decreasing, after said adjusting step, the spacing between the original and the predetermined zone of the workpiece in the Z direction without causing contact between them;

adjusting the relative position, along the X-Y plane, of the original and the predetermined zone of the workpiece placed opposed to the original, while maintaining the decreased spacing;

exposing, after said relative position adjusting step along the X-Y plane, the predetermined zone of the workpiece to the pattern of the original with radiation, while holding the predetermined zone of the workpiece and the original at the same spacing as assumed during said relative position adjustment along the X-Y plane; and increasing, after said exposure, the spacing between the original and the predetermined zone of the workpiece in the Z direction.

* * * * *

UNITED STATES PATENT AND TRADEMARK OFFICE
CERTIFICATE OF CORRECTION

PATENT NO. : 5,443,932
DATED : August 22, 1995
INVENTOR(S) : HIROHISA OHTA, et al.

Page 1 of 2

It is certified that error appears in the above-indentified patent and that said Letters Patent is hereby corrected as shown below:

ON THE TITLE PAGE:

[57] Abstract

Line 15, "is" should read --are--.

COLUMN 1

Line 9, "ARTS" should read --ART--.
Line 48, "if" should read --if,--.

COLUMN 4

Line 6, "wafer I" should read --wafer 1--.

COLUMN 5

Line 14, "is a" should read --a--.
Line 15, "and" should be deleted, and "that" should read --and that--.

UNITED STATES PATENT AND TRADEMARK OFFICE
CERTIFICATE OF CORRECTION

PATENT NO. : 5,443,932
DATED : August 22, 1995
INVENTOR(S) : HIROHISA OHTA, et al.

It is certified that error appears in the above-indentified patent and that said Letters Patent is hereby corrected as shown below:

COLUMN 7

Line 23, "and" should be deleted.
    Line 40, "valued" should read --values--.

COLUMN 8

Line 2, "spacing" should read --spacing;--.
    Line 53, "value" should read --values--.

Signed and Sealed this

Sixteenth Day of January, 1996

Attest:

BRUCE LEHMAN

*Attesting Officer*   *Commissioner of Patents and Trademarks*